United States Patent
Sugiyama

(10) Patent No.: US 6,249,478 B1
(45) Date of Patent: Jun. 19, 2001

(54) ADDRESS INPUT CIRCUIT AND SEMICONDUCTOR MEMORY USING THE SAME

(75) Inventor: Takashi Sugiyama, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/614,364

(22) Filed: Jul. 12, 2000

(30) Foreign Application Priority Data

Jul. 12, 1999 (JP) .................................................. 11-197772

(51) Int. Cl.$^7$ ...................................................... G11C 8/00

(52) U.S. Cl. .................................... 365/230.06; 365/225.7

(58) Field of Search ........................... 365/230.06, 225.7, 365/200; 327/525

(56) References Cited

U.S. PATENT DOCUMENTS 5,889,414 * 3/1999 Li et al. ......................... 365/230.06

* cited by examiner

*Primary Examiner*—Tan T. Nguyen
(74) *Attorney, Agent, or Firm*—Morrison & Foerster LLP

(57) ABSTRACT

An address input circuit is arranged between an address pad and an associated address buffer and includes: a first circuit having a fuse arranged between a power source and a first node and another fuse arranged between the node and the ground potential wherein the node is set close to the voltage of the power source; a second circuit having a fuse arranged between the power source and a second node and another fuse arranged between the node and the ground potential wherein the node is set close to the ground potential; a switching transistor wherein the gate is connected to the second node, the source or drain is connected to the first node and the drain or source is connected to the address buffer; and a fuse connected between the address pad and the address buffer.

6 Claims, 4 Drawing Sheets

ADDRESS INPUT CIRCUIT AND SEMICONDUCTOR MEMORY USING THE SAME

BACKGROUND OF THE INVENTION (1) Field of the Invention

The present invention relates to an address input circuit which divides the storage area of a semiconductor memory device into smaller capacity areas than the original without changing its circuit configuration and allows each divided area to be selected without changing any circuit configuration. The present invention also relates to a semiconductor memory using this address input circuit.

(2) Description of the Prior Art

As a conventional technology of semiconductor memories, Japanese Patent Application Laid-Open Sho 59 No.40392 discloses a semiconductor memory which, if it has any defective cell, can be used as a memory having a smaller storage capacity by discarding the defective portion. This device will be described hereinbelow with reference to the drawings.

FIG. 1 shows an address input portion on the upstream side of a semiconductor memory. Reference numerals 11-1 to 11-n designate address input terminals (to be referred to hereinbelow as pins) to which address data A0-An are supplied. Provided for each pin 11-0 through 11-n is an address buffer 12-0 through 12n which outputs a pair of address data values A0/A0, A1,/A1, . . . An,/An, having a complementary relationship therebetween based on address data values A0-An.

Inserted between each pin 11-0 through 11n and a corresponding address buffer 12-0 through 12-n is an enhancement-mode MOSFET 13-0 through 13-n. Further, an enhancement-mode MOSFET 14-0 through 14-(n-1) is inserted between each pin 11-0 through 11-(n-1) and the input terminal to each address buffer 12-1 through 12-n, which is more significant by one bit.

All the control gates of MOSFETs 13-0 to 13-n are connected to a common line 15 while all the control gates of MOSFETs 14-0 to 14-(n-1) are connected to a common line 16.

One of these lines, i.e., line 15 is connected at its upper end in the drawing, to a depletion-mode MOSFET 17, which in turn is connected to a Vcc supply which supplies a positive power source voltage Vcc. The gate of this MOSFET 17 is connected to the Vcc supply. The bottom end in the drawing of the line 15 is connected to a depletion-mode MOSFET 18, which in turn is connected to a Vdd supply which supplies a standard power source voltage Vdd. The gate of this MOSFET 18 is connected to the Vdd supply.

The dimensions of the two MOSFETs 17 and 18 are set appropriately so that line 15 residing between the two can be kept at the logical '1' level.

The other line, line 16 is connected at its upper end in the drawing, to a depletion-mode MOSFET 19, which in turn is connected to the above Vcc supply. The gate of this MOSFET 19 is also connected to the Vcc supply. The bottom end in the drawing of the line 16 is connected to a depletion-mode MOSFET 20, which in turn is connected to the above Vdd supply. The gate of this MOSFET 20 is also connected to the Vdd supply. The dimensions of the two MOSFETs 19 and 20 are set appropriately so that line 16 residing between the two can be kept at the logical '0' level.

FIG. 2 shows an address data fixing circuit which is provided for each address data output terminal of address buffer 12-0 through 12-n. This address data fixing circuit is composed of two enhancement-mode MOSFETs 31 and 32 so that the output data values Ai,/Ai can be fixed at in accordance with the control signals F11 and F12 regardless of the address data being given to the output terminal.

In the above configuration, in a normal state, all the MOSFETs 13-0 to 13-n are being turned on while all the MOSFETs 14-0 to 14-(n-1) are being turned off, so that the address data A0 through An being supplied at pins 11-0 through 11-n are transmitted by way of respective MOSFETs 13-0 through 13-n, which are all in the on-state, to the corresponding input terminals of address buffers 12-0 through 12-n.

In this case, based on address data A0 through An, any of the memory cells (not shown) can be selected. That is, this case is free from any defective memory cell.

FIG. 3 is a diagram showing a memory cell array. It is assumed that the left half of the cell array is selected by An=0 and the right half is selected by An=1. If the X-area in this figure, i.e., the area designated by An=0 has a defective memory cell, control signal F12 supplied to the address fixing circuit shown in FIG. 2 in address buffer circuit 12-n is set at '1'. This causes An to be '0' and/An to be '1' regardless of the address data being supplied to pin 11-n, so that the memory area designated by An=1 will not be selected. Therefore, in this case, this memory cell array can be used as a device having half the storage capacity of the original memory cell array.

As stated with reference to FIG. 1, the level of line 15 is kept at the logic '1' by MOSFETs 17 and 18 while the level of line 16 is kept at the logic '0' by MOSFETs 19 and 20. In this case, when there exists no defective bit in the memory area or in other words, when the entire original storage capacity is utilized, currents will flow through lines 15 and 16. Therefore, use of this conventional circuit configuration gives rise to a problem of extra current consumption.

Further, when the memory is used in a mode that allows partial or smaller capacity than the original capacity to be used, or when a certain address value is fixed, it is necessary to generate control signals F11 and F12 to be supplied to the address data fixing circuit which is provided for each address data output terminal of address buffer 12-0 through 12-n. In this case, the circuit for generating control signals F11 and F12 should be built in on the chip or the signals have to be input externally.

If the circuit for generating signals F11 and F12 is provided within the chip, an extra area is needed for that, resulting in increase in chip area and manufacturing cost. Alternatively, even when control signals F11 and F12 are input from an external logic, there occurs a similar problem as well as other extra problems such as the memory cannot be used individually, and the like.

SUMMARY OF THE INVENTION

The present invention has been devised under the consideration of the above circumstances and it is an object of present invention to provide an address input circuit which allows for selection of a memory data capacity from its original capacity or capacities smaller than the original while suppressing the current consumption to a low level no matter what capacity is selected. Further the present invention is to provide an address input circuit and a semiconductor memory using it for allowing independent use of the memory device.

In order to achieve the above object, the present invention Is configured as follows:

In accordance with the first feature of the present invention, an address input circuit capable of inputting an address data which has been fixed at the H-level or L-level to an address buffer or capable of inputting an address data from an address pad to the address buffer, includes:

a first circuit having a first fuse between a first node and a first power source and a second fuse between a second power source and the first node, the first node being set at a potential close to the voltage of the first power source;

a second circuit having a third fuse between a second node and the first power source and a fourth fuse between the second power source and the second node, the second node being set at a potential close to the voltage of the second power source;

a switching transistor wherein the control gate is connected to the second node, the source or drain is connected to the first node and the drain or source is connected to the address buffer; and a fifth fuse connected between the address pad and the address buffer.

In accordance with the second feature of the present invention, the address input circuit having the above first feature is characterized in that the voltage of the first power source is higher than that of the second power source.

In accordance with the third feature of the present invention, the address input circuit having the above second feature is characterized in that the first and second fuses are blown open while the third or fourth fuse are blown open when the address data being input to the address pad is input from the address pad to the address buffer; the second, fourth and fifth fuses are blown open when the address data which has been fixed at the H-level is input to the address buffer; and the first, fourth and fifth fuses are blown open when the address data which has been fixed at the L-level is input to the address buffer.

In accordance with the fourth feature of the present invention, the address input circuit having the above second feature is characterized in that the first and second fuses are blown open while the third and fourth fuse are blown open when the address data being input to the address pad is input from the address pad to the address buffer; the second, fourth and fifth fuses are blown open when the address data which has been fixed at the H-level is input to the address buffer; and the first, fourth and fifth fuses are blown open when the address data which has been fixed at the L-level is input to the address buffer.

In accordance with the fifth feature of the present invention, a semiconductor memory includes: a plural number of address input circuits according to any one of first through fourth features, each of which is interposed between an address pad and an address buffer paired therewith.

In accordance with the sixth feature of the present invention, a semiconductor memory includes: an address input circuit according to any one of first through fourth features, being interposed at least between the most significant address pad and the most significant address buffer.

According to the features of the present invention, when the entire storage capacity of the semiconductor memory device is used, the fuses in the first and second circuits of the address input circuit are blown open so that the address data input through the address pad is directly supplied to the address buffer. In this case, no current will flow in the first and second circuits since the fuses therein are blown open.

When the semiconductor memory is used as a memory having a smaller capacity than its original storage capacity, the fuses inserted between the address pad and address buffer associated with the selected capacity are blown open so that the address data input through the address pad will not be input to the address buffer while the associated input is fixed at '0' or '1' by appropriately cutting the fuses in the first and second circuits.

Accordingly, the present invention enables the address data to be fixed at the H-level or L-level without the necessity of an external control signal, or enables the address data being supplied to the address pad to input those address data to the address buffer, so as to allow the full or partial use of the original memory capacity. Further, the present invention provides an address input circuit as well as a semiconductor memory using it, which has no increase in consumption current even when the device is used in the full capacity mode and which allows the memory device to be used independently.

DESCRIPTION OF THE PREFERRED EMBODIMENT

The embodiment of the present invention will hereinafter be described in detail with reference to the accompanying drawings.

Figure 1:
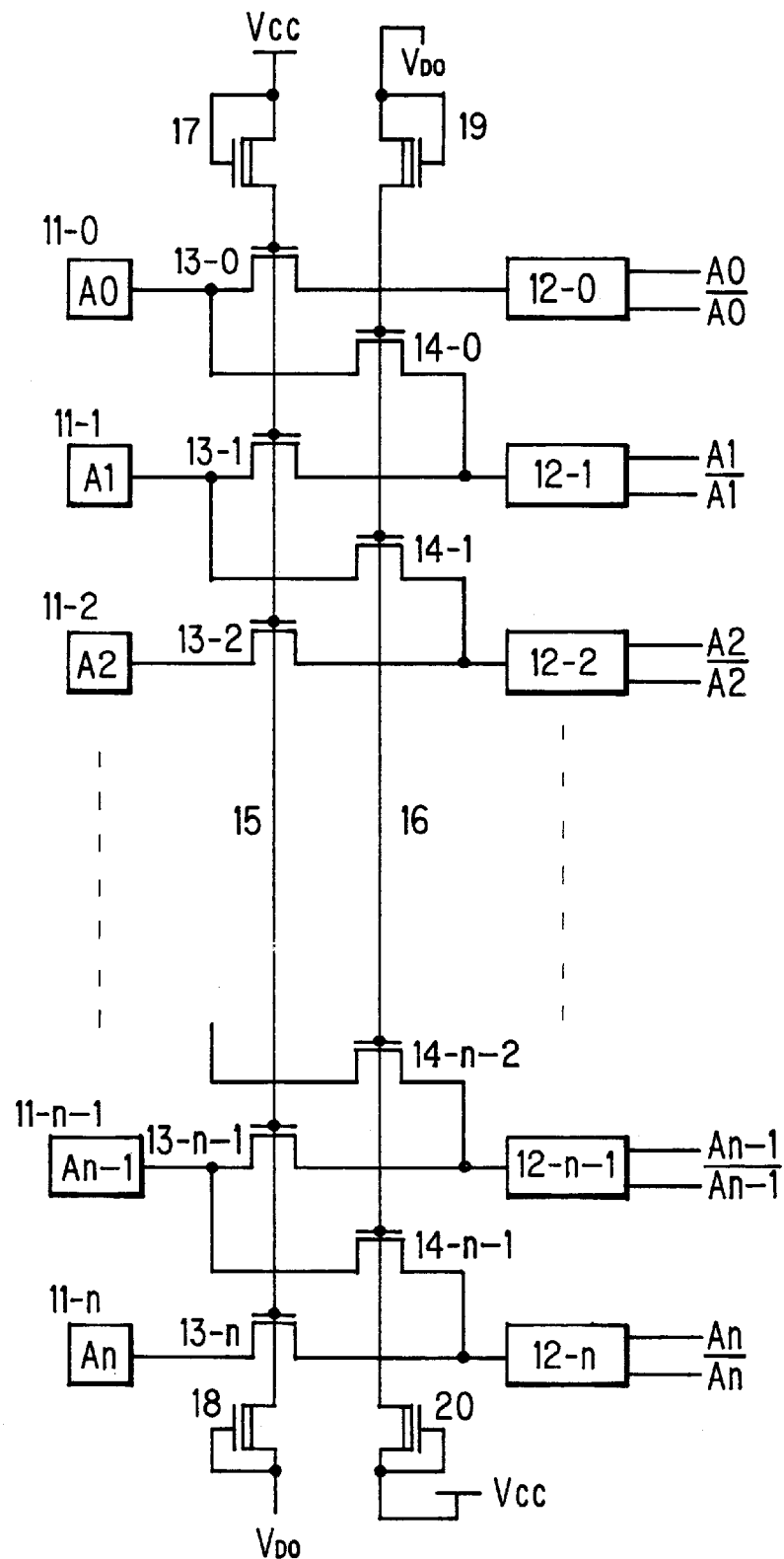
FIG. 1 is an illustrative view showing a conventional address input portion.
Figure 2:
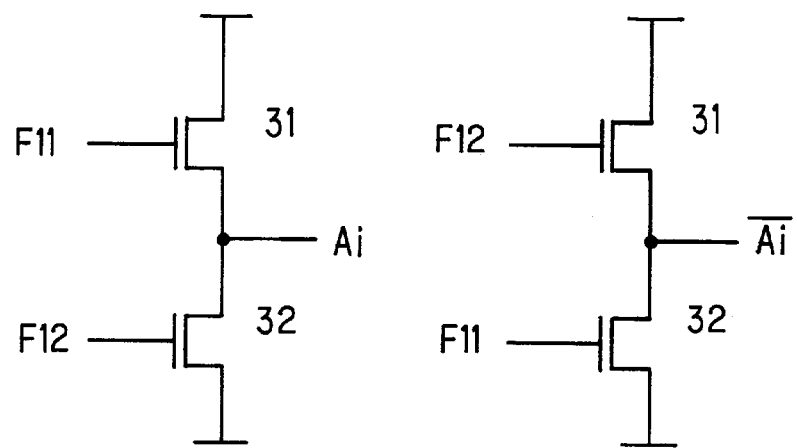
FIG. 2 is a circuit diagram showing a conventional address buffer.
Figure 3:
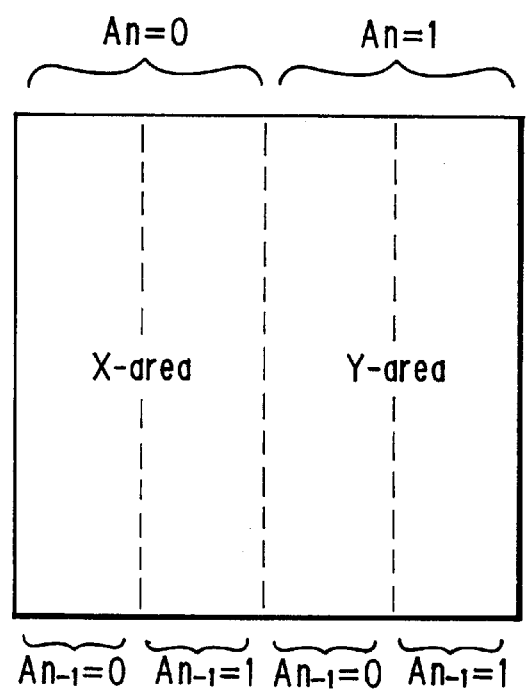
FIG. 3 is an illustrative view showing a memory array.

In FIG. 3, when it is assumed that ROM areas X and Y are allowed to be read out when the most significant address terminal An is set at '0' and '1', respectively, each of ROM areas X and Y will have half the original storage capacity of the device.

Figure 4:
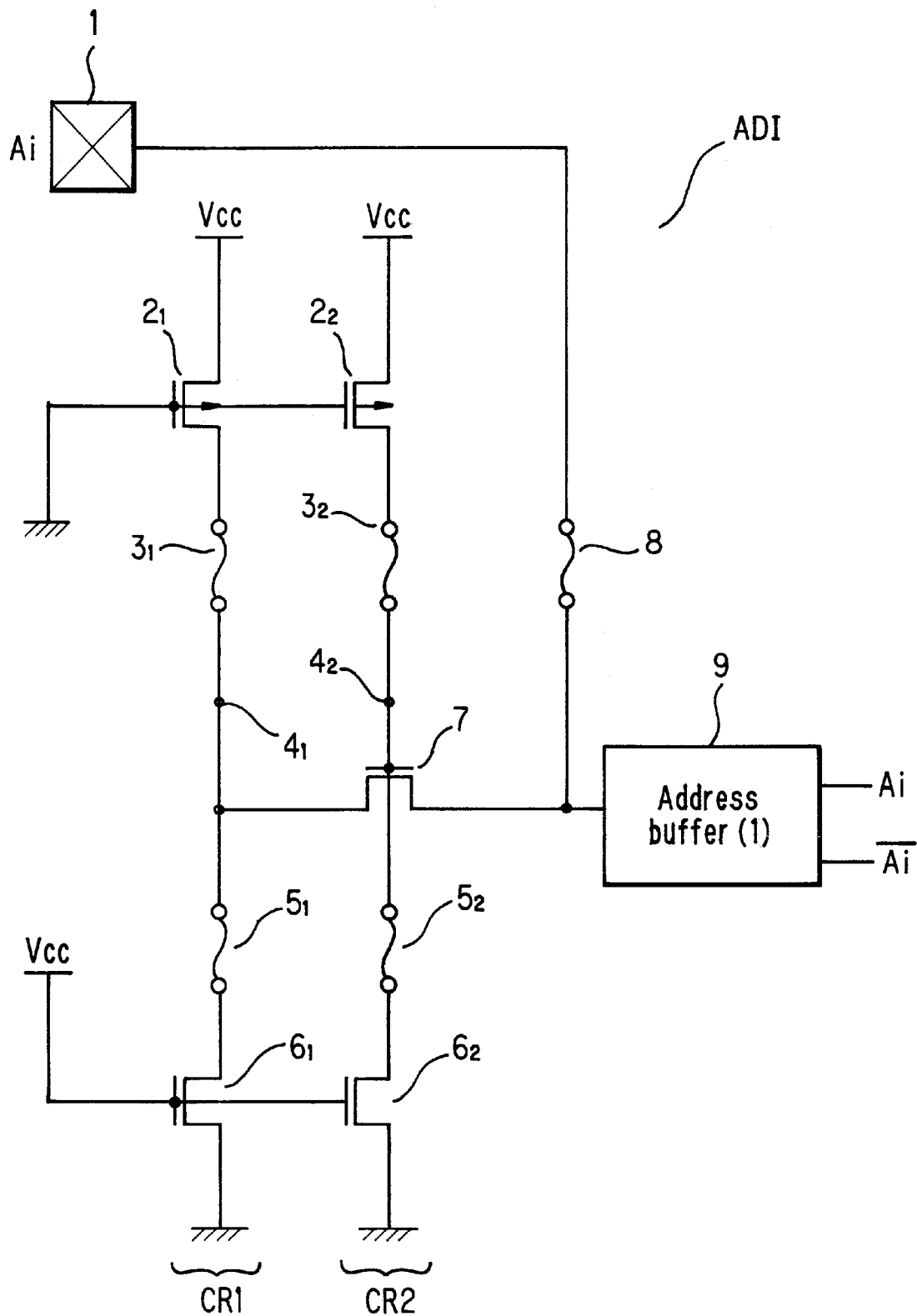
FIG. 4 is an illustrative view showing an address input portion according to the embodiment of the present invention.

To enable a memory device to be used as that having one half the original storage capacity, an address input circuit shown in FIG. 4 is used as a means for fixing the state of the most significant address bit An at '0' or '1' without any circuit modification.

FIG. 4 illustrates only the portion corresponding to the most significant address input pad of the address data input portion constituting part of a non-volatile semiconductor memory in accordance with the present invention.

An address data input portion ADI is arranged between an address input pad 1 and an address buffer 9 and is generally configured of a polysilicon fuse 8, a first circuit CR1, a second circuit CR2 and a transistor 7 as a selection switch.

Address input pad 1 is one for the most significant address input and is connected to address buffer 9 by way of polysilicon fuse 8 (to be referred to hereinbelow as fuse 8). Here, fuse 8 may and should be composed of an interconnecting material such as metal wire, etc. which can be cut by laser beams.

Figure 5:
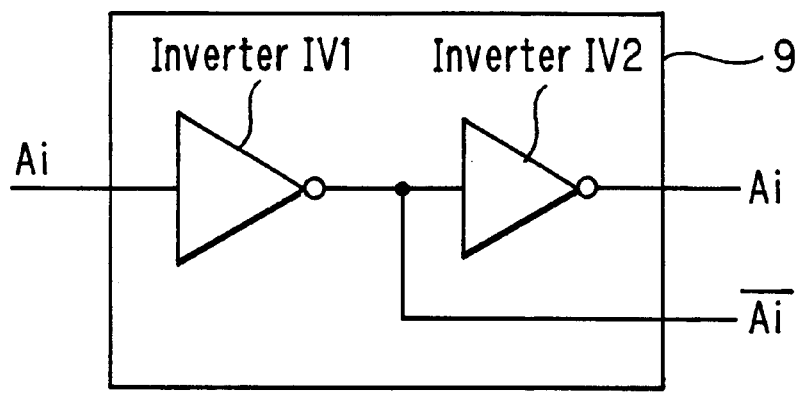
FIG. 5 is a circuit diagram showing an address buffer according to the embodiment of the present invention.

Address buffer 9, as shown in FIG. 5, is composed of a pair of inverters IV1 and IV2 connected in series and provides an output /Ai which is the inverted one from inverter IV1 on the upstream side and another output Ai which the further inverted one from inverter IV2 on the downstream side.

As shown in FIG. 4, first circuit CR1 is generally composed of a voltage power source Vcc, a P-channel transistor $2_1$, polysilicon fuses $3_1$ and $5_1$ (to be referred to hereinbelow as fuses $3_1$ and $5_1$) and an N-channel transistor $6_1$.

The gate of P-channel transistor $2_1$ is connected to GND, the source is connected to voltage power source Vcc and the drain is connected to the drain of N-channel transistor $6_1$ via fuses $3_1$ and $5_1$ connected in series.

The gate of N-channel transistor $6_1$ is connected to voltage power source Vcc while the source is connected to GND.

Second circuit CR2 is generally composed of voltage power source Vcc, a P-channel transistor $2_2$, a polysilicon fuse $3_2$ and $5_2$ (to be referred to hereinbelow as fuses $3_2$ and $5_2$), and an N-channel transistor $6_2$.

The source of P-channel transistor $2_2$ is connected to voltage power source Vcc, and the drain is connected to the drain of N-channel transistor $6_2$ via fuses $3_2$ and $5_2$ connected in series. The gate of N-channel transistor $6_2$ is connected to voltage power source Vcc while the source is connected to GND.

Next, the connected conditions of an N-channel transistor 7 will be described.

Assuming that $4_1$ designates a node on the interconnection between the aforementioned P-channel transistor $2_1$ and N-channel transistor $6_1$ and that $4_2$ designates a node on the interconnection between P-channel transistor $2_2$ and N-channel transistor $6_2$, the gate of N-channel transistor 7 is connected to node $4_2$, the source to node $4_1$, and the drain to address buffer 9.

Here, for P-channel transistors $2_1$, $2_2$ and N-channel transistors $6_1$, and $6_2$, the channel lengths and channel widths of them are appropriately designated so that node $4_1$ presents a potential representing the logical '1' and node $4_2$ presents a potential representing the logical '0'. Instead of using the ON-state resistances based on the designation of the channel lengths and channel widths of P-channel transistors $2_1$, $2_2$ and N-channel transistors $6_1$ and $6_2$, resistance elements may also be used.

The above node is a point at which elements are joined in the circuit so that the connected elements should present (or present) the same potential at the point.

Here, the reason node $4_1$ in first circuit CR1 is set at the logic 'H' state while node $4_2$ in second circuit CR2 is set at the logic 'L' state is to prevent N-channel transistor 7 (switching transistor) from turning on during wafer testing.

Usually, a wafer test is performed to judge whether there are defective memory cells. In this test, address data is directly input to the address buffer through the address pad so that all the memory cells are checked whether they are acceptable or defective. Therefore, when the wafer test is performed, fuses $3_1$, $3_2$, $5_1$, $5_2$ and 8 in address input circuit ADI shown in FIG. 4 should be left uncut. Then, after the completion of the wafer test, one or more of fuses $3_1$, $3_2$, $5_1$, $5_2$ and 8 should be cut in accordance with the determination result of the wafer test, whereby it is possible to provide a semiconductor memory having a specific size.

For this purpose, if N-channel transistor 7 is in the ON-state during the wafer test, the predetermined address data cannot be input to the address buffer, resulting in inability of determining whether individual memory cells are acceptable or not. Therefore, node $4_1$ is set at the logical 'H' and node $4_2$ is set at the logical 'L' so that N-channel transistor 7 is definitely turned off to carry out the wafer test.

Here, to set node $4_1$ of first circuit CR1 at the logical 'H', the ON-state resistances of P-channel transistor $2_1$ and N-channel transistor $6_1$ in first circuit CR1 are set to be small and large, respectively, so as to set node $4_1$ of first circuit CR1 close to the power supply voltage Vcc.

To set node $4_2$ of second circuit CR2 at the logical 'L', the ON-state resistances of P-channel transistor $2_2$ and N-channel transistor $6_2$ in second circuit CR2 are set to be large and small, respectively, so as to set node $4_2$ of second circuit CR2 close to the ground level.

In order to set the ON-resistance of a transistor to be large, the channel length should be set large relative to the channel width. On the other hand, in order to set the ON-resistance to be small, the channel length should be set small relative to the channel width.

Next, a readout means for reading a non-volatile semiconductor memory having a specific size in accordance with the determined result from the wafer test will be described.

First of all, when the original capacity of the device (non-volatile semiconductor memory) is usable, that is, when the input to the most significant address buffer 9 is input to the most significant address pad 1, fuses $3_1$, $5_1$, $3_2$ and $5_2$ are blown open. Here, fuse $5_2$ may be either blown or not. Because switching transistor 7 is of an N-channel one, this switching transistor 7 is in the off-state even if fuse $5_2$ is not blown. If switching transistor 7 is formed of a P-channel one, fuse $3_2$ may be either blown open or not.

In this arrangement, when the input from address pad 1 is directly input through fuse 8 to address buffer 9, all the data in the device will be readable. In this case no current increase occurs in address input circuit ADI since fuses $3_1$, $5_1$, $3_2$ and $5_2$ are cut.

Description will be made on a case where the ROM area X is read out or where the most significant address buffer input is fixed at '0'.

In this case, first, fuse 8 is blown open using a laser etc., so that the input from the most significant address pad 1 will not enter address buffer 9.

Next, fuse $3_1$ is blown open so that the potential at node $4_1$ is set at the logical '0'. Further, fuse $5_2$ is blown open so that the potential at node $4_2$ is set at the logical '1', to thereby turn on N-channel transistor 7.

As a result, the potential at node $4_1$ is directly input to address buffer 9. That is, no matter what state the most significant address input is in, the input to the most significant address buffer 9 is fixed at '0'. This situation is observed externally as if the most significant address input were fixed at '0' so that the ROM area X can be read out.

Description will be made on a case where the ROM area Y is read out or where the most significant address buffer input is fixed at '1'.

Also in this case, first, fuse 8 is blown open using a laser etc., so that the input from the most significant address pad 1 will not enter address buffer 9. Next, fuse $5_1$ is blown open so that the potential at node $4_1$ is set at the logical '1'. Further, fuse $5_2$ is blown open so that the potential at node $4_2$ is set at the logical '1', to thereby turn on N-channel transistor 7.

Resultantly, the potential at node $4_1$ is directly input to the address buffer. That is, no matter what state the most significant address input is in, the most significant address buffer input is set at '1'. This situation is observed externally as if the most significant address input were fixed at '1', so that the ROM area Y can be read out.

The above embodiment was described on a case where address input circuit ADI is provided between the most significant address pad and the address buffer, the second most significant address data is also fixed in a similar manner so that it is possible to set up a memory area having a quarter of the original memory capacity (see FIG. 3).

The configuration shown in FIG. 4 may be applied to all the bits of the address data, or may be applied to particular bits of address data as stated above.

Figure 6:
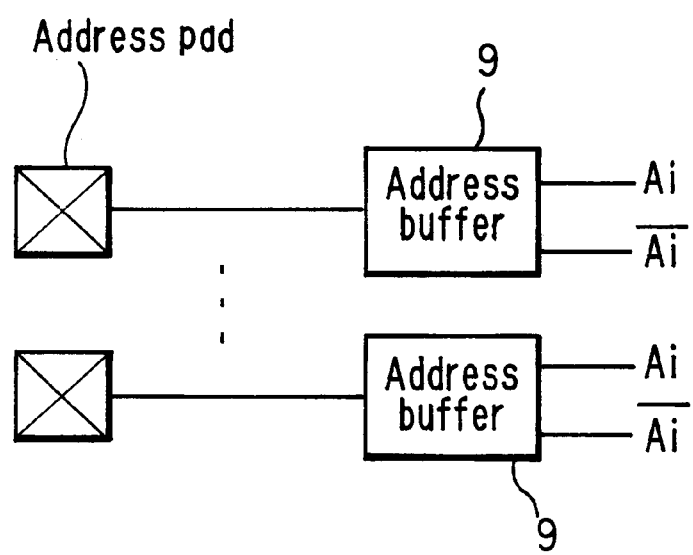
FIG. 6 is a block diagram showing a configuration between address pads and address buffers with no address input portion in accordance with the embodiment of the present invention.

Here, other than that shown in FIG. 4 for the particular bits of address data, the address pad and address buffer can be connected directly as shown in FIG. 6.

In the case where the most significant address data is fixed at '0' or '1', if different sets of ROM data have been written into ROM areas X and Y (or further the halves of these areas) in FIG. 3, it is possible to select and use, as appropriate, one from the two kinds of data stored in one device, since the most significant address data can be selectively set at '0' or '1' using address input circuit ADI.

Further, on the assumption that the same ROM data has been written into both ROM areas X and Y, when defective bits exist in only one area, it is possible to select the other area which is free from defective bits by controlling address input circuit ADI in the above manner. In this case, the device can be used as an acceptable device having half the original capacity.

As has been described heretofore, in accordance with the present invention, it is possible to fix an arbitrary bit of address data at the H-level or L-level without using any external control signal, so as to set the memory as having the original memory data capacity, or having half or quarter the original data capacity. Further, by writing different kinds of ROM data into the thus partitioned memory areas in a single device, two or more kinds of ROM data can be set within the single device. Accordingly, one kind of data can selectively used from the two or more kinds of ROM data.

Further, even when the device is used in the full capacity mode, no increase in consumption current will occur. To fix address bits, no external control signal is needed so that the memory device can be used independently.

What is claimed is:

1. An address input circuit capable of inputting an address data which has been fixed at the H-level or L-level to an address buffer or capable of inputting an address data from an address pad to the address buffer, comprising:

a first circuit having a first fuse between a first node and a first power source and a second fuse between a second power source and the first node, the first node being set at a potential close to the voltage of the first power source;

a second circuit having a third fuse between a second node and the first power source and a fourth fuse between the second power source and the second node, the second node being set at a potential close to the voltage of the second power source;

a switching transistor wherein the control gate is connected to the second node, the source or drain is connected to the first node and the drain or source is connected to the address buffer; and a fifth fuse connected between the address pad and the address buffer.

2. The address input circuit according to claim 1, wherein the voltage of the first power source is higher than that of the second power source.

3. The address input circuit according to claim 2, wherein the first and second fuses are blown open while the third or fourth fuse are blown open when the address data being input to the address pad is input to the address buffer;

the second, fourth and fifth fuses are blown open when the address data which has been fixed at the H-level is input to the address buffer; and the first, fourth and fifth fuses are blown open when the address data which has been fixed at the L-level is input to the address buffer.

4. The address input circuit according to claim 2, wherein the first and second fuses are blown open while the third and fourth fuse are blown open when the address data being input to the address pad is input to the address buffer;

the second, fourth and fifth fuses are blown open when the address data which has been fixed at the H-level is input to the address buffer; and the first, fourth and fifth fuses are blown open when the address data which has been fixed at the L-level is input to the address buffer.

5. A semiconductor memory comprising:

a plurality of address input circuits according to any one of claims 1 through 4, each of which is interposed between an address pad and an address buffer paired therewith.

6. A semiconductor memory comprising:

an address input circuit according to any one of claims 1 through 4, being interposed at least between the most significant address pad and the most significant address buffer.

* * * * *